US008351710B2

(12) United States Patent
Thust et al.

(10) Patent No.: US 8,351,710 B2
(45) Date of Patent: Jan. 8, 2013

(54) METHOD AND ELECTRON MICROSCOPE FOR MEASURING THE SIMILARITY OF TWO-DIMENSIONAL IMAGES

(75) Inventors: Andreas Thust, Cologne (DE); Juri Barthel, Aachen (DE)

(73) Assignee: Forschungszentrum Juelich GmbH, Juelich (DE)

( * ) Notice: Subject to any disclaimer, the term of this patent is extended or adjusted under 35 U.S.C. 154(b) by 907 days.

(21) Appl. No.: 12/310,052

(22) PCT Filed: Jul. 25, 2007

(86) PCT No.: PCT/DE2007/001314
§ 371 (c)(1),
(2), (4) Date: Feb. 9, 2009

(87) PCT Pub. No.: WO2008/019644
PCT Pub. Date: Feb. 21, 2008

(65) Prior Publication Data
US 2009/0268969 A1 Oct. 29, 2009

(30) Foreign Application Priority Data
Aug. 16, 2006 (DE) .......................... 10 2006 038 211

(51) Int. Cl.
*G06K 9/68* (2006.01)
*G06K 9/34* (2006.01)
(52) U.S. Cl. ...................................... 382/218; 382/173
(58) Field of Classification Search .................. 382/173, 382/218, 255, 284
See application file for complete search history.

(56) References Cited

U.S. PATENT DOCUMENTS

| 5,300,776 | A * | 4/1994 | Krivanek ..................... 250/307 |
| 6,587,581 | B1 | 7/2003 | Matsuyama et al. |
| 2005/0072920 | A1 | 4/2005 | Inada |
| 2005/0247884 | A1 | 11/2005 | Nakamura et al. |

FOREIGN PATENT DOCUMENTS

| EP | 1 037 253 | 9/2000 |
| JP | 2005-302468 | 10/2005 |

OTHER PUBLICATIONS

Chand (Aberration determination and Compensation in High Resolution Transmition Electron Microscopy), a Dissertation, University of Cambridge, pp. 51-81, 1995.*

(Continued)

*Primary Examiner* — Daniel Mariam
(74) *Attorney, Agent, or Firm* — Jordan and Hamburg LLP

(57) ABSTRACT

Disclosed is a method for measuring the similarity of two-dimensional images, at least one image exhibiting an additional signal, the location dependence or symmetry properties of which are known at least approximately. The images are partitioned into mutually identical subimages such that the extension of at least one subimage in the direction of the gradient of the additional signal is smaller than the extension of this subimage in the direction perpendicular thereto. The subimages are compared separately, and the results of all comparisons are combined to form the measurement result for similarity. As a result, the method becomes insensitive to variations in the additional signal. The method is particularly suited for the determination of defocusing and astigmatism of an electron-microscopic image. For this purpose, it is important to compare the similarity of an experimentally measured image to simulated images, which were generated using defined defocusing and astigmatism values.

31 Claims, 5 Drawing Sheets

OTHER PUBLICATIONS

Gonzales, R.C., Woods, R.E.: "Digital Image Processing" 2002, Prentice Hall, XP007903260 p. 701, last paragraph-p. 704, paragraph 1.

Zemlin, J., Zemlin, F.: "Diffractogram tableaux by mouse click" Ultramicroscopy vol. 93, No. 1, 2002,—2002 pp. 77-82, XP007903133 cited in the application Seite 78, Spalte 1, Kapital 2-Seite 78, Spalte 2, Kapitel 3.

Faulkner H M L et al: "Computational aberration determination and correction" Optics Communications, North-Holland Publishing Co. Amsterdam, NL, vol. 216, No. 1-3, Feb. 1, 2003, pp. 89-98, XP004404786 ISSN: 0030-4018 abstract p. 89, col. 1, paragraph 1-p. 90, col. 1, paragraph 3.

F. Zemlin, K. Weiss, P. Schiske, W. Kunath and K.-H. Herrmann "Coma-Free Alignment of High Resolution Electron Microscopes With the Aid of Optical Diffractograms" Ultramicroscopy 3 (1978) 49-60.

Stephen Uhlemann, Maximilian Haider "Residual wave aberrations in the first spherical aberration corrected transmission electron microscope" Ultramicroscopy 72 (1998) 109-119.

A. Thust, M.H.F. Overwijk, W.M.J. Coene, M. Lentzen "Numerical correction of lens aberrations in phase-retrieval" Ultramicroscopy 64 (1996) 249-264.

Image Fusion Quality Assessment Based on Structural Similarity Di Hongwei, Liu Xianfeng Institute of Optoelectronic Engineering, Jinan University, Guangzhu 510632 Recevied date : Jan. 4, 2006 vol. 34, No. 5—ACTA PHOTONICA SINICA—May 2006 1994-2011 China Academic Journal Electronic Publishing House. http://www/enki,net pp. 12/23-17/23.

* cited by examiner

METHOD AND ELECTRON MICROSCOPE FOR MEASURING THE SIMILARITY OF TWO-DIMENSIONAL IMAGES

The invention relates to a method for measuring the similarity of two-dimensional images and to an electron microscope for performing the method.

BACKGROUND OF THE INVENTION

In a transmission electron microscope, an electron beam is directed at the object to be analyzed and then depicted by way of electromagnetic lenses after traversing the object. In a manner similar to lenses for visible light, electromagnetic lenses for diffracting electrons have image defects, and these image defects can degrade the resolution capacity of the microscope. Such image defects are referred to as aberrations. In conventional electromagnetic circular lenses, so-called spherical aberration is by far the strongest image defect. In addition to spherical aberration, a variety of other aberrations exist, which can be categorized based on different mathematical systems. For example, in addition to defocusing and astigmatism, which in ophthalmology are equivalent to the terms near-sighted/far-sighted and astigmatism of the eye, many other types of aberration occur, such as axial coma, third-, fourth-, fifth-, and sixth-order astigmatism, star aberration, three leaf clover aberration, and many more. The number and/or order of the aberrations, which play a significant role in a transmission electron microscope with respect to the imaging quality, climb with the increasing resolution capacity of the microscope. The knowledge and/or the correction of aberrations plays a crucial role in the modern transmission electron microscope, the resolution capacity of which is only slightly greater than, or even less than, 0.1 nanometers.

In order to be able to determine aberrations of a transmission electron microscope, the tilted tableau, or Zemlin tableau, method (F. Zemlin et al., "Coma-free alignment of high resolution electron microscopes with the aid of optical diffractograms", Ultramicroscopy 3, 49-60 (1978)) is generally employed. For this purpose, images of a thin amorphous object site are recorded under different tilt angles of the incident electron beam, and the effective defocusing and effectively present astigmatism are determined for each individual image of the tilt series. Effectively present defocusing and astigmatism, as the lowest order aberrations, are induced by the higher order aberrations, and thus it is possible to determine the desired unknown aberrations of a higher order from the defocusing and astigmatism values from the tilt series.

While, in the case of conventional electron microscopes, which exclusively comprise electromagnetic circular lenses, it is possible to determine a variety of aberrations using the tilted tableau method described above, the correctable aberrations are limited to defocusing, second- and third-order astigmatism, and axial coma. In particular, while the strongly dominating spherical aberration can be determined in a microscope fitted with circular lenses, it cannot be corrected.

In order to increase the resolution capacity, an electron microscope having a corrector for spherical aberration is known from (S. Uhlemann, M. Haider: "Residual wave aberrations in the first spherical aberration corrected transmission electron microscope", Ultramicroscopy 72, 109-119 (1998)). In addition to circular lenses, this corrector comprises two electromagnetic hexapoles, which allow for the compensation of the spherical aberration. In order to even be able to adjust and use the corrector in the desired manner, which in turn may unintentionally create a variety of additional aberrations, the aberrations that are still unknown are first determined, likewise using the tilted tableau method. Thereafter, in particular the spherical aberration determined in this way, and several other aberrations, can be compensated for through proper adjustment of the hardware corrector as early as during the imaging process. Once again, the determination of aberrations by means of defocusing and astigmatism measurements plays a crucial role.

In order to determine defocusing and astigmatism in an experimentally recorded image of a thin amorphous object site, a Fourier space representation of the same is created. This Fourier space representation, which is also referred to as a diffractogram, has a stripe pattern that is typical of the respective defocusing and astigmatism. The goal is to quantitatively pick up the stripe pattern and to be able to assign defocusing and astigmatism values to it clearly and with maximum precision.

For the detection of the stripe pattern, a variety of possible diffractograms are computed, which differ with respect to defocusing and astigmatism. These computed diffractograms are then compared, either visually by eye, or by machine, to the experimentally obtained diffractogram in order to determine the defocusing and astigmatism values actually present in the experiment based on maximum similarity between the experimental and simulated stripe patterns. A reference to machine-based pattern detection can be found in (A. Thust et al., "Numerical correction of lens aberrations in phase-retrieval HRTEM", Ultramicroscopy 64, 249-264 (1996)) and in (S. Uhlemann, M. Haider: "Residual wave aberrations in the first spherical aberration corrected transmission electron microscope", Ultramicroscopy 72, 109-119 (1998)), but the cited references do not in any way address the special algorithmic implementation of pattern detection. Visual pattern detection by eye is described in (Johannes Zemlin, Friedrich Zemlin "Diffractogram tableaux by mouse click", Ultramicroscopy 93 77-82, (2002)). The latter visual method of pattern detection is not suited for practical, daily use, due to the slow speed and subjective nature of the human comparison of patterns, so that only the machine-based comparison of patterns remains as a proven means for determining defocusing and astigmatism values in order to determine microscope aberrations.

The comparison of an experimental diffractogram to simulated diffractograms according to the state of the art is highly error-prone and imprecise, since the experimentally measured diffractogram is superimposed both with strong additive and multiplicative interferences, the intensity of which can by far exceed that of the useful signal. The separation of strong additive and multiplicative interferences that are difficult to quantify from the actual useful signal is a challenge, which up to now has not been satisfactorily resolved. First, there is the risk that the useful signal is not even detected against the background interference, which is to say that the interfering signal is interpreted as a useful signal, which can produce a completely incorrect result and/or result in a breakdown of the stripe detection process. Secondly, there is the risk that even if the separation of the interfering and useful signals is successful in principle, the result of the defocusing and astigmatism determination does not satisfy the quantitative accuracy requirements. In the first case, it is not possible to adjust the microscope aberrations, and in the latter case, while the microscope can be roughly adjusted, the residual aberrations still present due to the imprecise measurement do not allow for optimum utilization of the performance capability of the microscope.

SUMMARY OF THE INVENTION

It is therefore an object of the invention to provide a method for measuring the similarity of two images, which is less sensitive to interference than the methods according to the state of the art, and which can notably be used to determine astigmatism and defocusing in electron microscopes. It is also an object of the invention to provide an electron microscope that performs the method.

These objects are achieved, according to the invention, by a method according to the main claim and by an electron microscope according to the additional independent claim. Further advantageous embodiments are apparent from the dependent claims referring to these claims.

As part of the invention, a method was developed for measuring the similarity of two two-dimensional images composed of pixels having intensity values. For this purpose, at least one image exhibits an additional signal, the location dependence or symmetry properties of which are known at least approximately.

The term "image" as defined in this invention shall not be not limited to depictions in position space, but may in particular also comprise Fourier representations in spatial frequency space, and specifically diffractograms supplied by electron microscopes.

An additional signal as defined in this invention shall be particularly an additive and/or multiplicative signal which, in the region of the image, can be considerably stronger and can also change considerably more than the useful signal present in the image that the user wishes to process. An additional signal generally makes the similarity measurement more difficult, and can also distort the results.

Frequently, the location dependence or the symmetry properties of the additional signal are known at least qualitatively. In the case of electron microscope images, this applies in particular to the scattering function of the atoms in the object being analyzed, to the kinematic envelope associated with the object thickness, the damping envelope caused by temporary temporal or spatial coherence, and the modulation transmission function of the detector used for imaging. Depending on the experimental source thereof, such an additional signal may also be statistical image noise. In general, noise is a statistical phenomenon; nonetheless, noise behavior is frequently subject to systematic laws. For example, the mean time value of noise can be location-dependent in a predictable manner. Likewise, it is possible that while the location dependence and/or the symmetry properties of the additional signal are not known a priori, they are clearly apparent from the image exhibiting the same.

According to the invention, the images are now partitioned into mutually identical subimages such that the extension of at least one subimage in the direction of the gradient of the additional signal is smaller than the extension of this subimage in the direction perpendicular thereto. Then, mutually associated subimages are compared to each other, wherein the comparison should be performed independently of the context of the overall image. The results of these comparisons are finally combined into an overall measure of the similarity of the two images.

It was found that even a rough knowledge, or even assumptions alone, regarding the location dependence or symmetry properties of the additional signal generally suffices for estimation of at least the direction of the gradient thereof. Due to the small extension of the subimage in the direction of this gradient, the additional signal now varies comparatively little within this subimage. Due to a comparatively large extension in the direction perpendicular thereto, at the same time, the subimage receives a large number of structures attributable to the useful signal, and the structures can be used for measuring the similarity.

Thus, without having to experimentally determine the additional signal more precisely, the additional signal is prevented from being passed on to the final result of the similarity measurement. Such a determination was usually required according to the state of the art, which frequently resulted in complete failure of the similarity measurement.

It was found that the partitioning according to the invention particularly reduces passing on of additive and multiplicative additional signals, which undergo considerable spatial change in the overall image, to the measurement result. Within the subimages, these additional signals substantially act as only additive or multiplicative constants, which have no effect on the comparison.

This shall be clarified based on an example: Analyze an arbitrary original image having arbitrary structures and then create a distorted image, in which all intensity values are doubled in one half of the image. The distorted image thus exhibits a multiplicative additional signal in one half of the image. A comparison of the image according to the state of the art, such as using a two-dimensional correlation function, subsequently attests to a clearly reduced similarity between the original image and the distorted image, even though no significant changes to the structures has occurred. If the partitioning according to the invention is performed, with the two image halves being selected as subimages, the original image and the distorted image are viewed as being nearly identical. Thus, the method according to the invention is better suited for comparing the similarity of structures in images than the methods according to the state of the art without partitioning.

The term "subimage" shall expressly not be limited to rectangular image sections. A subimage can be circular or ring-shaped, for example. It does not have to be planar, but, for example, can also have a line shape, wherein the line should have a width of at least one pixel.

In general, the subimages should represent the isolines or isosurfaces on which the additional signal only changes slightly. At the same time, a subimage should always contain a characteristic and clearly detectable variation in the useful signal, which can be used for the comparison.

If, for example, both the useful signal and the additional signal have a circular symmetry, circular ring-shaped subimages are not suitable because the useful signal in these is also constant. In the specific description section, an embodiment is provided for a necessary compromise which, in this case, is between influence by the additional signal and the significance of the useful signal recorded with the subimage.

In the case of scanning imaging methods, such as scanning probe microscopy, the pixels of an image are frequently taken in sequence. If, for example, a tip scans over a specimen, the image is recorded line by line. Such imaging methods frequently result in stripe-shaped artifacts, since the time interval between adjoining image pixels in the scan direction is considerably less than the time interval between two image pixels adjoining in the direction perpendicular thereto. In this case, line-shaped, narrow stripes are advantageous as the subimages.

Optionally, prior to partitioning, it may be advantageous to transform the images into a representation in which an advantageous partitioning into subimages is more clearly apparent. For example, transition to a Fourier representation is advantageous if the additional signal in this representation has symmetries, or isotropies, in certain spatial directions. If the differences in intensity within the images are extremely high, it may also be advantageous to logarithmize them prior to partitioning.

Advantageously, the images are processed in polar coordinates. If the images are stored in an electronic memory, the representation in polar coordinates results in an arrangement of the data in the memory that can be read sequentially with defined configurations for the similarity comparison. A specified data volume can be read much more quickly sequentially than in random order.

The mutually associated subimages are preferably compared to one another using a similarity measure from the group consisting of cross-correlation coefficient, sum of error squares, or chi-square sum. These similarity measures do not change if the one subimage is changed, with respect to the mutually associated subimage, by an additive or multiplicative constant.

If the images are laterally displaced from one another by an offset, this offset should first be determined based on the maximum of the correlation function. Prior to a further similarity comparison, the images should then be displaced relative to one another by the determined offset.

The results of the comparisons of subimages are preferably combined via a linear combination into an overall measure of the similarity of the two images. For example, measurement results for the similarity of subimages, which are obtained using a similarity measure, can be added. Provided that reasons exist for preferring individual subimages over others, this can be taken into account in the linear combination via different weighting factors for these subimages.

For example, the more pixels the subimages contain, the greater the weighting factors can be. A higher weighting factor then corresponds to a larger surface area in the case of two-dimensional subimages, and to a greater line length in the case of line-shaped, quasi one-dimensional subimages. In this respect, the number of pixels is an advantageous criterion for varying the weighting of the subimages, since a subimage having more pixels generally also has more features attributable to the useful signal.

However, there may also be experimental criteria for defining varying weighting factors for different subimages. For example, different subimages may vary in terms of their being passed on to a measurement variable that is to be determined from the overall results for similarity. In transmission electron microscopy, for example, defocusing and astigmatism have considerably stronger effects on higher spatial frequencies than on lower ones; they have a substantially square dependence on the spatial frequency. If the similarity of two images determined according to the invention is to be used as measure for the defocusing or astigmatism of one of the images, it may therefore be advantageous to weight subimages associated with higher spatial frequencies more heavily. This is particularly easy in a Fourier representation, since the radial distance from the center of the representation provides the spatial frequency.

On the other hand, situations arise in which particular regions having high spatial frequencies should be assigned a lower weighting. Due to coherence effects, in transmission electron microscopy, the useful signal can be damped considerably more strongly at high spatial frequencies than at low spatial frequencies, so that the ratio between the useful signal and the additional signal worsens with high spatial frequencies.

In transmission electron microscopy, other influencing factors that can be considered for weighting factors are the spatial resolution of the detector, or a spatial frequency-dependent scatter intensity of the object to be analyzed.

In a particularly advantageous embodiment of the invention, the additional signal, in polar coordinates, depends more strongly on the radius than on the azimuth. This shall be understood such that, for at least the predominant number of pixels, the radial gradient of the additional signal is larger than the azimuthal gradient thereof. In this case, circular ring-shaped regions are particularly suited as subimages. The shape of one or more subimages, however, can also be periodically modulated around a circular ring line in order to ensure that each subimage contains clear structures attributable to the useful signal.

During imaging using a transmission electron microscope, it is always possible to create conditions under which, in the Fourier representation, and particularly in diffractograms, the additional signal, in polar coordinates, depends substantially only on the radius, and is azimuthally isotropic. To this end, it suffices to suppress both object drift and unusually high aberrations. Both conditions can be experimentally verified. Unusually high aberrations can optionally also be eliminated iteratively.

During imaging using a transmission electron microscope, the additional signal has both an additive and a multiplicative fraction.

The additive fraction is caused by inelastically scattered electrons. Since the object is amorphous and the inelastic atomic scattering factors are isotropic, this additive fraction is isotropic in the overall. This fraction, however, is highly dependent on the spatial frequency. In a Fourier representation, which typically provides diffractograms, this additive fraction is thus highly radius dependent, while being azimuthally isotropic.

The multiplicative fraction is composed of values from the envelopes of the partial temporal and spatial coherence, the atomic scattering factors, and from the modulation transmission function of the detector used for imaging. In the Fourier representation, if the electron microscope is adjusted well, all these values are likewise azimuthally isotropic, which is to say they only depend on the spatial frequency value. However, this dependency is very strong and also very complicated. The partitioning according to the invention blocks the influence of this dependency on the result of the similarity measurement.

The subimages do not have to be disposed at a distance from one another, and may, in fact, even overlap. As a result, the union set of all the subimages may comprise a share of at least 80 percent, and particularly of at least 90 percent, of all of the available pixels.

Ideally, the union set of all the subimages comprises all the pixels, with the exception of physically disadvantageous regions, such as those occurring, for example, at the center of diffractograms recorded with electron microscopes. In a first stage, the information present in the images can then be evaluated only in small independent portions, while in the overall the information is fully utilized.

In a particularly advantageous embodiment of the invention, an experimentally measured image and a simulated image are selected as the images. The method can then be employed in order to determine the approximate values of measurement variables, which can be used as simulation parameters for the generation of the simulated image, for the experimentally measured image. For this purpose, subimages should be selected in which the intensity values of the simulated image vary at least across a predetermined fluctuation range, so that the interferences in the experimentally measured image are not amplified so as become large defects in the determined measurement variables.

Measurement variables can, for example, be determined by way of the method according to the invention by determining a new simulated image is from the measurement result of the method, this image being more similar to the experimentally measured image than the originally simulated image. For this purpose, parameter optimization methods may be employed.

Examples of suitable optimization methods include simplex methods, and gradient-free optimization methods, such as the Hooke-Jeeves method. The optimization can be performed iteratively until maximum similarity is achieved between the experimentally measured and simulated images. The simulation parameters with which this result is achieved can then be regarded as approximate values for the associated measurement variables in the experimentally measured image.

For example, an electron microscope can be used for obtaining the experimentally measured image. The method can then be employed, for example, in order to determine the astigmatism and defocusing variables, which cannot be measured directly, by the roundabout way of the similarity between the simulated and experimentally measured images. For this purpose, at least astigmatism and defocusing are used as simulation parameters for generating the simulated image.

Advantageously, aberrations in the electron microscope can be determined from the astigmatism and defocusing values of a series of experimentally measured images, for example according to the Zemlin method. In principle, this is possible because astigmatism and defocusing are also aberrations in the broader sense. Thus, these variables are physically linked to the aberrations to be determined. The aberrations to be determined are the solutions to an over-determined linear equation system, the coefficients of which are determined from all measured astigmatism and defocusing instances.

This procedure is comparable to the task of identifying an unknown object in a closed container, which can be viewed only through a small opening. The series of measured images corresponds to multiple shakings of the container in order to obtain different views of the object. The more views are available, the more precisely the object can be identified. Small interferences and defects in the views, however, can result in a completely erroneous identification result. This analogy exemplifies how important it is to use the method according to the invention to make the image comparison less sensitive to interference.

In particular, the electron microscope can be adjusted to correct for the determined aberrations and the method can then be started again. In this way, the correction of the aberrations, and thus the resolution of the microscope, can be iteratively optimized.

The method can be used, not only for a one-time adjustment of the microscope prior to the actual measurement, but also for readjustment during the measuring operation. This is also required for maximum resolutions, since several interfering factors affecting the aberrations depend on ambient conditions, such as the temperature.

In a particularly advantageous embodiment of the invention, the simulated image is selected prior to partitioning by a quick comparison to the experimentally measured image. It was found that, with the method according to the invention, in the determination of measurement variables in particular, a very large number of images are initially possible as simulated images. For example, there may be a catalog of simulated images, which were simulated using different values for the measurement variables to be determined. A quick comparison will clearly show which image from this catalog is most similar to the experimentally measured image. Thereafter, in order to determine the measurement variables more precisely, a few other variants on this image can be determined and compared to the experimentally measured image by way of partitioning.

The partitioning is then performed only for these few variants and not for all the images from the original catalog. Since the partitioning takes significantly longer than a quick comparison, this results in a drastic reduction of the overall computation time that is required.

In one embodiment of the method according to the invention, the catalog comprises 40,000 simulated images. A quick comparison achieves 200,000 similarity comparisons per second, which is to say it finds the simulated image from the catalog that is most similar to the experimentally measured image in 0.2 seconds. If all image comparisons were performed by way of the partitioning, requiring 1.5 milliseconds per comparison, the comparison of the experimentally measured image with all 40,000 simulated images from the catalog would take approximately one minute.

For the quick comparison it is advantageous to discretize the intensity values of the pixels of at least one of the images to 16 or fewer, and particularly to two, possible values per pixel. The quick comparison can then be performed with fewer arithmetic operations. Advantageously, logic operations, and particularly the exclusive Or (XOR), are suited as methods for quick comparison, a discretization to two possible values per pixel being necessary for the XOR operation. Variants on the XOR operation, for example the XNOR operation, are also suitable. The truth table for the logic operation should be such that the output value thereof clearly indicates whether the input values are identical or not.

In one embodiment, eight adjacent pixels are represented by the eight bits of a byte for the quick comparison using the XOR operation, for the experimentally determined image and in the simulated image. If the two pixel values are the same in both images, the bit resulting from the XOR operation shows a 0; if they differ, the resulting bit is a 1. As a result, the output value of 0 or 1 provides a clear statement as to whether the input pixel values (bits) are identical. Overall, an XOR operation on the bytes associated with the two images produces a resulting byte, in which the number of ones indicates the number of concordant pixels (from 0 to 8). The conversion of the byte value to this number (comparison number) is performed by way of a lookup table (value table) having 256 entries. At the end, all (here: 512) comparison numbers are added. Since a byte constitutes only a small region in the diffractogram, this method is resistant to long-range variations in the additional signal.

The quick comparison is also an embodiment of a method for measuring the similarity of two two-dimensional images composed of pixels having intensity values. The images are partitioned into mutually identical subimages, which are represented by bytes in this embodiment. Mutually associated subimages (bytes) are compared with one another, here by way of the XOR operation. The results of these comparisons, which in this embodiment are the comparison numbers, are combined into an overall result for the similarity of the two images, which in this embodiment is by way of addition of all comparison numbers. Because of the resistance to long-range variations of the additional signal, this simplified method functions in an manner analogous to the method according to the main claim, wherein the extension of at least one subimage in the direction of the gradient of the additional signal is smaller than the extension of this subimage in the direction perpendicular thereto. In particular, in a manner analogous to the method according to the main claim, it is also possible to determine measurement variables, such as defocusing and astigmatism of an electron microscope. The simplified method, however, can also be employed completely separately therefrom. As will be explained below, the simple partitioning into bytes, in which adjacent pixels are combined, also allows the defocusing and astigmatism of electron microscopes to be determined twice as precisely as according to the state of the art.

Advantageously, the simulated image is selected from a precomputed catalog. This is possible for determining defocusing and astigmatism, since the number of possible values is specified by the hardware of the microscope and therefore identical for each measurement. In this case, it is advantageous to scale the experimentally measured image down to a lower resolution. If the images have symmetries, which is true for diffractograms, then, in addition, only the non-redundant part of the images (in the case of diffractograms after averaging of one of the four quadrants) should be used for the quick comparison. This combination of measures limits storage requirements for the catalog, without requiring any major compromises in terms of the accuracy of the quick comparison.

As part of the invention, an electron microscope having an improved interpretable resolution was developed.

The interpretable resolution shall be understood as the inverse of the lowest spatial frequency at which an uncertainty in the determination of the associated aberration function occurs that is larger than $\pi/4$ (Rayleigh criterion). At even higher spatial frequencies, an uncertainty in the aberration function of more than $\pi/4$ can be assumed. The associated information is no longer represented correctly in the image and can therefore no longer be interpreted ad-hoc by way of observation.

This microscope comprises a digital image sensor, a device for tilting the electron beam relative to the object to be analyzed, a lens arrangement for correcting aberrations, and a controller for this lens arrangement.

According to the invention, an adjustment device for the lens arrangement is provided. This adjustment device comprises:
 a simulation unit, which is able to deliver ideal electron-microscopic images of test structures having predetermined values for the defocusing and astigmatism thereof;
 a comparison unit, which is connected to the image sensor and the simulation unit and which is able to measure the similarity between an image supplied by the image sensor and by the simulation unit; and
 an evaluation unit, which is connected to the comparison unit and the controller and which is able to approximately determine the aberrations of the electron microscope from the measured similarity and the associated defocusing and astigmatism values and convert the aberrations into an adjustment command for the controller.

Once again, the term "image" shall not be limited to direct depictions in position space, but also includes, for example, Fourier representations in Fourier space, and particularly diffractograms or logarithms of these diffractograms.

The term "image" is also not limited to representations in Cartesian coordinates, but in particular also comprises representations in polar coordinates. For example, due to the symmetry properties thereof, diffractograms are frequently represented in polar coordinates.

Following the depiction of a test structure using the microscope, the simulation unit can generate ideal images having the same test structure until the comparison unit detects a high level of similarity between the ideal image and the image determined by way of the microscope.

The measured similarity can then be used together with the associated defocusing and astigmatism values in order to determine the aberrations of the electron microscope. The adjustment command for the controller is in turn configured so that the aberrations determined are eliminated in the next imaging step.

The aberrations of the microscope depend on several boundary conditions that vary over time. Examples of such boundary conditions are the room temperature, the cooling water temperature, and time and location-dependent electrostatic fields resulting from the charge states of the object. The adjustment unit according to the invention is able to adjust the correction of the aberrations to these changed boundary conditions during the measurement operation.

In a particularly advantageous embodiment of the invention, the comparison unit is able to perform the method according to the invention for measuring the similarity of two images. It is able to do so, for example, if it comprises means for such partitioning of the ideal image and the image determined by way of the microscope (supplied by the digital image sensor) into mutually identical subimages such that the extension of at least one subimage in the direction of the gradient of an additional signal present in at least one of the images is smaller than the extension of this subimage in the direction perpendicular thereto. As in the description of the method, an additional signal shall be understood in particular as an additive and/or multiplicative signal which is considerably stronger in the region of the image, and also changes considerably more than the useful signal present in the image, which the user desires to process. An additional signal generally makes similarity measurement more difficult, and can also distort the results.

The method according to the invention is both faster and more precise than the methods according to the state of the art, the measurement results of which are significantly distorted, in particular by interferences in the images recorded with the microscope. If the comparison unit is able to perform the method according to the invention, the aberrations of the microscope can be determined more precisely by the evaluation unit. The adjustment command generated by the evaluation unit for the controller then prompts the lens arrangement to almost completely compensate for the existing aberrations of the microscope, without overcompensating. As a result, the interpretable resolution that can be achieved with the microscope increases.

In a further advantageous embodiment of the invention, the comparison unit comprises means for a discretization of the intensity values of the pixels of at least one of the images to 16 or fewer, and particularly to two, possible values per pixel. The image comparison can then be performed considerably faster, due to the lower volume of information to be processed. For such a quick image comparison, the comparison unit may, for example, comprise means for an exclusive Or operation (XOR) between two discretized images. However, it may also comprise a digital signal processor (DSP). In addition to the exclusive Or operation, this processor may also perform further quick comparison methods. The truth table of a logic operation used as the comparison method should be such that the output value thereof clearly indicates whether the input values are identical or not. The quick comparison of discretized images is used in the working embodiment of the electron microscope as a preliminary stage for the more precise, but slower, image comparison by way of partitioning. In this manner, the time that the adjustment unit requires for determining the appropriate adjustment command for the controller is drastically shortened.

The adjustment unit may comprise at least one computer having a computer program, and in particular it can be implemented completely as a computer program, which communicates via suitable computer hardware interfaces with the image sensor, the controller, and optionally the device for tilting the electron beam. In the same manner as programmable logic modules, the computer is then employed as a universal electronics system, the function of which is assigned by the computer program. A computer, used as a universal electronics system, is a mass-produced item, and is therefore considerably less expensive per unit of output than specially manufactured electronics systems. In addition, it has the advantage that certain subsequent improvements of the physical adjustment unit can be transferred to the electronic microscope in the non-physical form of a software download. Such updates are inexpensive, as no waste is incurred from electronic components and an installation technician does not have to visit.

If the computer is also connected to the device for tilting the electron beam, the adjustment unit can also automatically record the test images required for the determination of defocusing and astigmatism. It can then adjust the electron microscope without any interaction with the user whatsoever. For example, during breaks, an automatic readjustment can be performed at defined intervals so to ensure that the full interpretable resolution is available for the next user without any waiting period. The computer may, in particular, be a commercially available workplace computer having suitable hardware interfaces, an industrial computer, or in particular a computer in an embedded system. An embedded system is preferably only provided with the functionality that is required for the use thereof as a universal electronics system. All remaining components are absent. As a result, compared to a workplace computer, embedded system requires less installation space and energy.

Embodiments of the method according to the invention and of the electron microscope according to the invention allow the defocusing and astigmatism of a diffractogram to be measured with an average accuracy of approximately 0.2 nanometers. In this way, it is possible to bring the interpretable resolution into the range of the physical resolution, which is presently approximately 0.8 nanometers. The quick comparison by means of the XOR operation alone already achieves an accuracy of approximately 2 nanometers.

The physical resolution, also referred to as the information limit, is the size of the smallest object detail that can be transmitted by the microscope in any way. It remains the same in the event of a change in defocusing or astigmatism.

Determining the aberration function with an accuracy better than $\pi/4$, even with a physical resolution of 0.5 nm, which is not yet achievable today, appears to be within reach.

According to the state of the art, defocusing and astigmatism can only be determined with an accuracy of 4 nanometers, which is worse by a factor of two than the rough quick comparison according to the invention, and worse by a factor of 20 than by way of computation-intensive partitioning.

Hereafter, the subject matter of the invention will be described in more detail ased on the drawings, without thereby limiting the subject matter of the invention.

DESCRIPTION OF THE PREFERRED EMBODIMENTS

Figure 1:
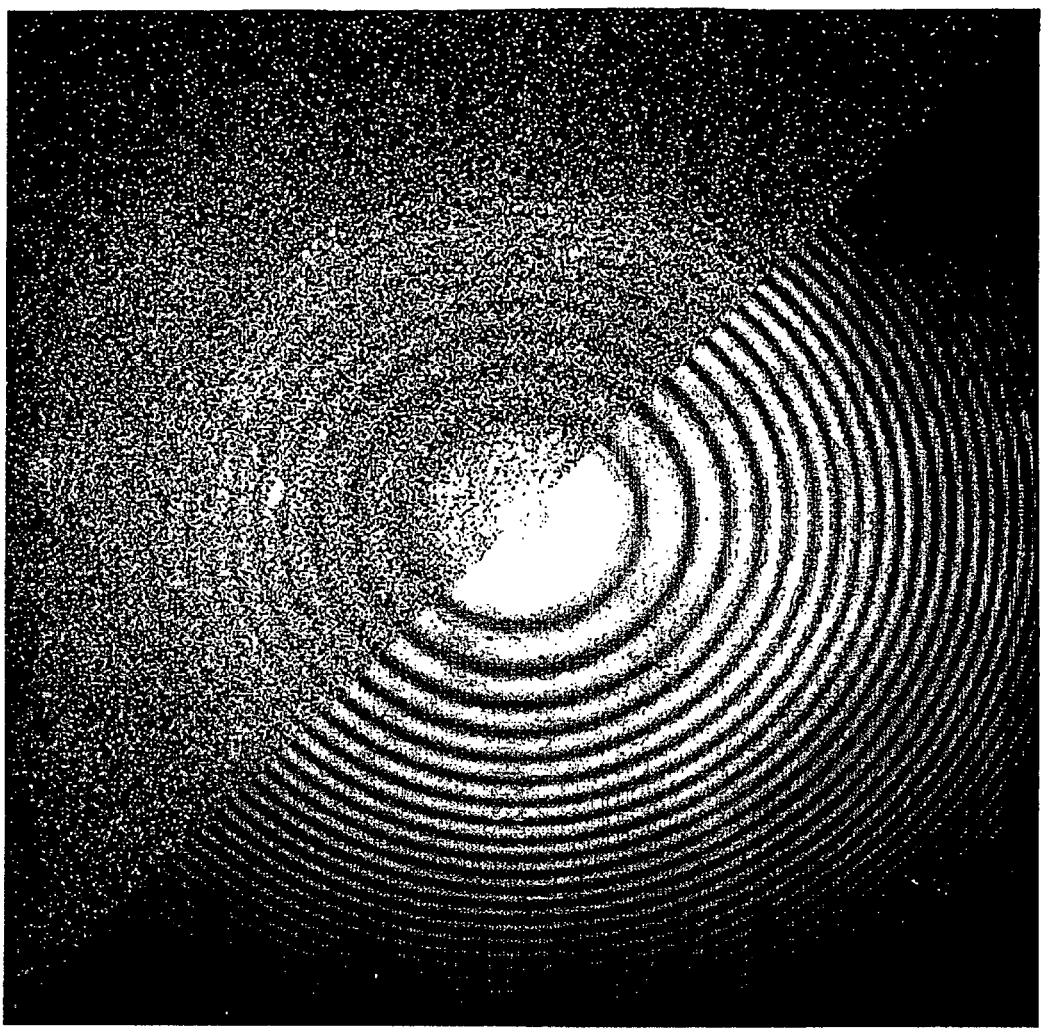
FIG. 1 shows experimentally measured (upper left half) and simulated (lower right half) diffractogram of a thin amorphous object.

FIG. 1 shows an electron-microscopic depiction (diffractogram) of a thin amorphous object, shown in Fourier space (spatial frequency space). The upper left half shows an experimentally measured image. The lower right half shows the simulated image, which comes closest to the experimentally measured image. This simulated image embodies the useful signal present in the experimentally measured image. However, it already contains additional signals, such as damping envelopes, which inevitably occur in the experimentally measured image. In this way, this ensures that the purely visual similarity between the experimentally measured image and the simulated image is only influenced by changes of the two measurement variables of interest, which is to say defocusing and astigmatism.

The ring patterns are also referred to as Thon rings. The shape thereof depends on the angle of incidence of the electron beam, the electron wavelength, the spherical aberration constant, the effective defocusing, and the effective two-dimensional astigmatism. In the experimentally measured image, the noise can be clearly recognized, which makes the measurement of the similarity between the experimentally measured and simulated images more difficult.

Figure 2A:
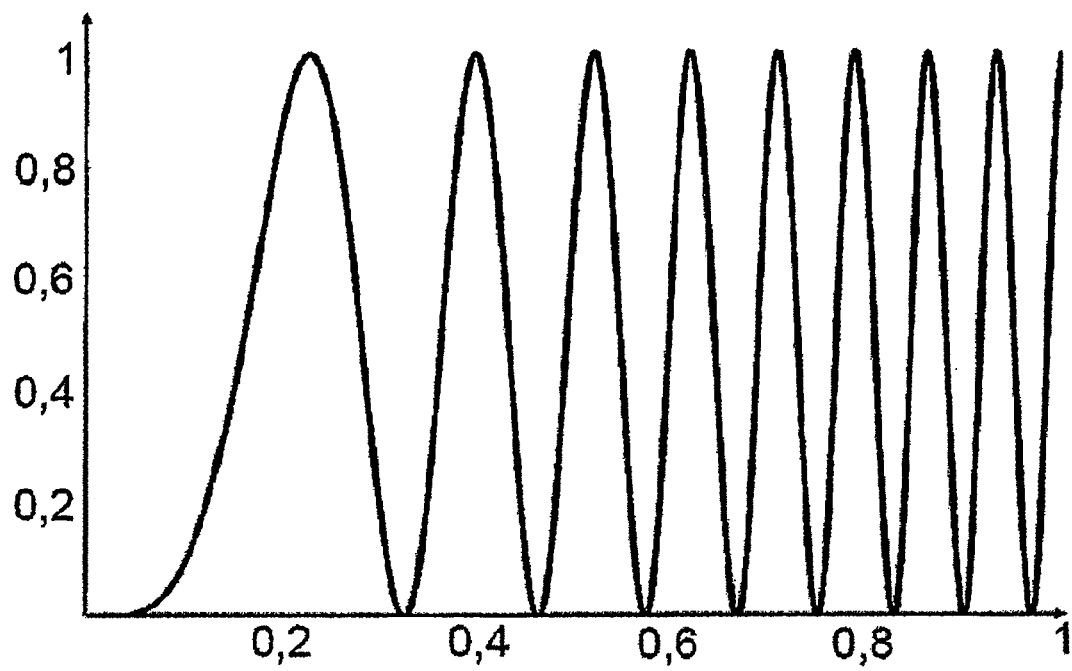
FIG. 2 shows comparison of useful signal (FIG. 2a), the superposition thereof with a multiplicative additional signal (FIG. 2b), and an additional superposition with additive noise as a further additional signal (FIG. 2c).

The Thon rings can be described as the square of the value the coherent transmission function $CTF(g_x, g_y)$, which is dependent on two-dimensional coordinates $(g_x, g_y)$ in Fourier space. It is specified by $$CTF(g_x, g_y) = \sin[2\pi\chi(g_x, g_y)]$$

wherein $\chi$ is the aberration function. This function is specified by $$\chi(g_x, g_y) = \frac{1}{4}C_s\lambda^3(g_x^2 + g_y^2)^2 + \frac{1}{2}Z\lambda(g_x^2 + g_y^2) + \frac{1}{2}A_{2x}\lambda(g_x^2 - g_y^2) + \frac{1}{2}A_{2y}\lambda(2g_x g_y)$$

and depends on the following variables:
$C_s$: Spherical aberration constant
$\lambda$: Electron wavelength
Z Defocusing
$A_{2x}$: x-component of the two-dimensional astigmatism vector $A_2$
$A_{2y}$: y-component of the two-dimensional astigmatism vector $A_2$
$g_x$: x-component of the diffraction vector g
$g_y$: y-component of the diffraction vector g FIG. 2 shows a one-dimensional radial section through a diffractogram as in FIG. 1, starting from the image center. The ordinate axis shows the spatial frequency in arbitrary units. The abscissa axis shows the intensity in arbitrary units. FIG. 2a shows the useful signal to be expected in the ideal case. The signal $S(g_x, g_y)$, the section of which is shown here, can be described by $$S(g_x, g_y) = [CTF(g_x, g_y)]^2$$

Figure 2B:
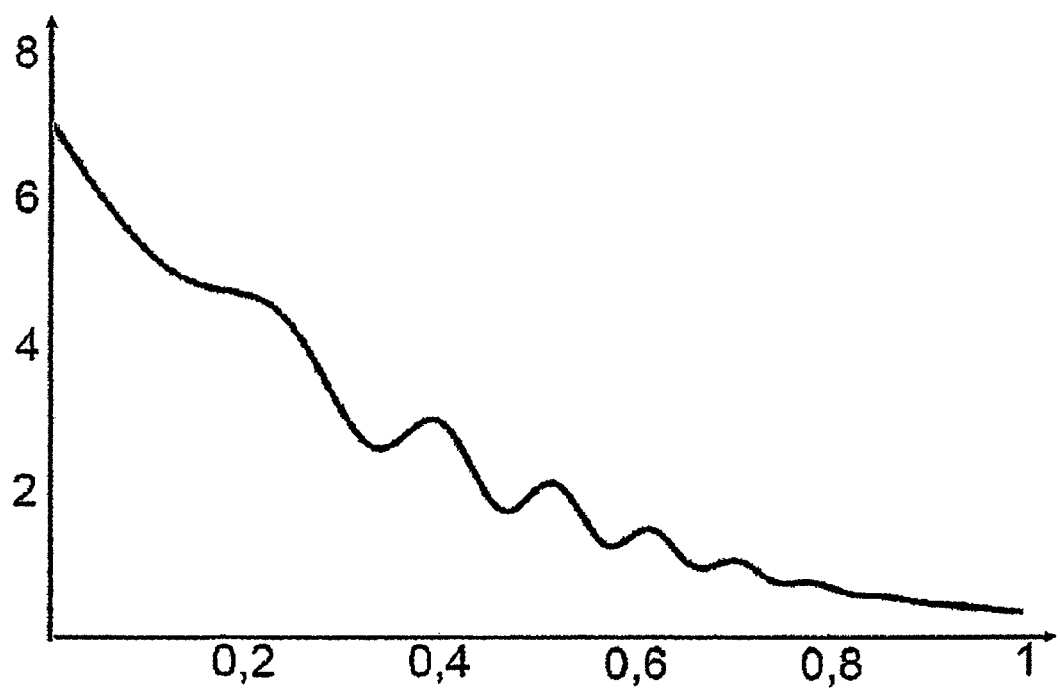

FIG. 2b shows a section of the superposition of this useful signal having typical multiplicative additional signals $D(g_x, g_y)$, such as
the scattering cross-section of the atoms in the object;
the influence of the finite thickness of the object;

the influence of temporal and spatial decoherence, due to which, some of the electrons can no longer contribute to the interference pattern;

the transmission function of the detector.

Figure 2C:
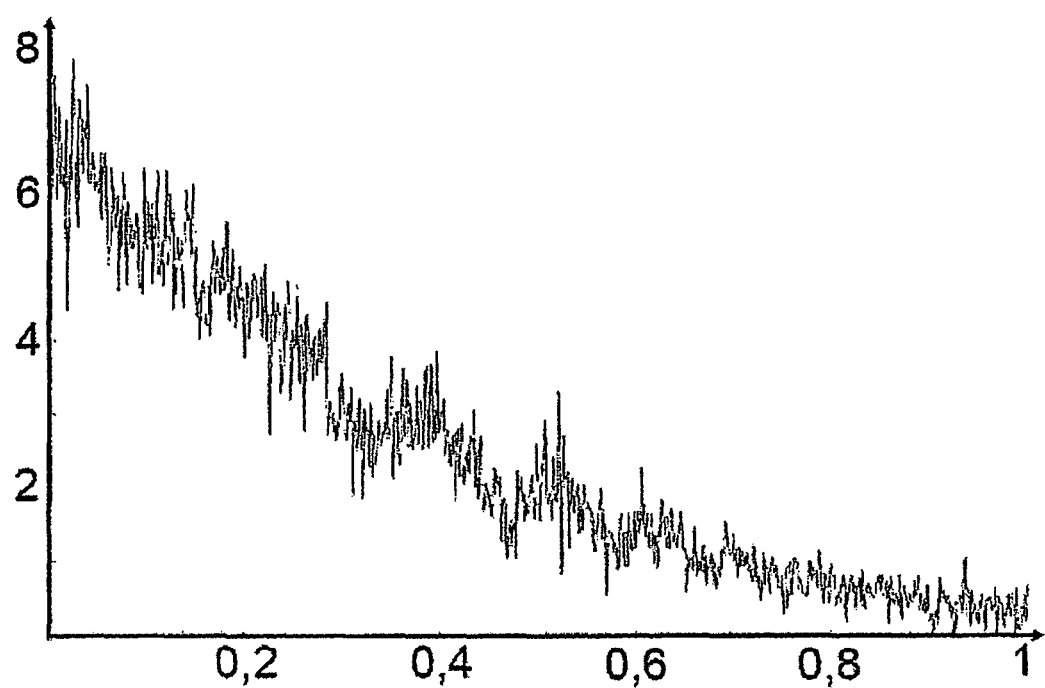

FIG. 2c shows a section of a multiplicatively distorted signal, on which is additionally superimposed the additive background $B(g_x, g_y)$, which changes slowly in the spatial frequency space, and static, high-frequency noise $N(g_x, g_y)$ (having a signal-to-noise ratio of approximately 1) as further additional signals. The signal E(gx,gy), the section of which is shown here, corresponds to the experimentally measured signal and has the form $$E(g_x,g_y)=S(g_x,g_y)\times D(g_x,g_y)+B(g_x,g_y)+N(g_x,g_y)$$

It is obvious that the section shown in FIG. 2c has little in common with the section according to FIG. 2a. The additional signals are several times stronger than the useful signal. In the two-dimensional image comparison, the precise measurement of the similarity between a simulated image having defined defocusing and astigmatism values and an experimentally measured image is accordingly difficult.

FIG. 3 shows examples of possible and advantageous subimages. In FIG. 3a (high astigmatism), circular rings were selected. The reason for this is that both the multiplicative and the additive additional signals in the spatial frequency space (which is used in all figures for the representation) depend only on the spatial frequency value, and hardly on the azimuthal direction thereof. When taking the nature of the additional signals into consideration in this manner, the experimentally measured signal $E(g_x,g_y)$ has the form $$E(g_x,g_y)=S(g_x,g_y)\times D(g)+B(g)+N(g)$$

In polar coordinates, this means that the additional signals are only dependent on the radius $g=(g_x^2+g_y^2)^{1/2}$, but not on azimuth $\arctan(g_x,g_y)$. The gradient of the additional signals is thus a purely radial gradient. The subimages are narrow in the direction of this gradient, but they are expanded in the azimuthal direction perpendicular thereto.

Figure 3A:
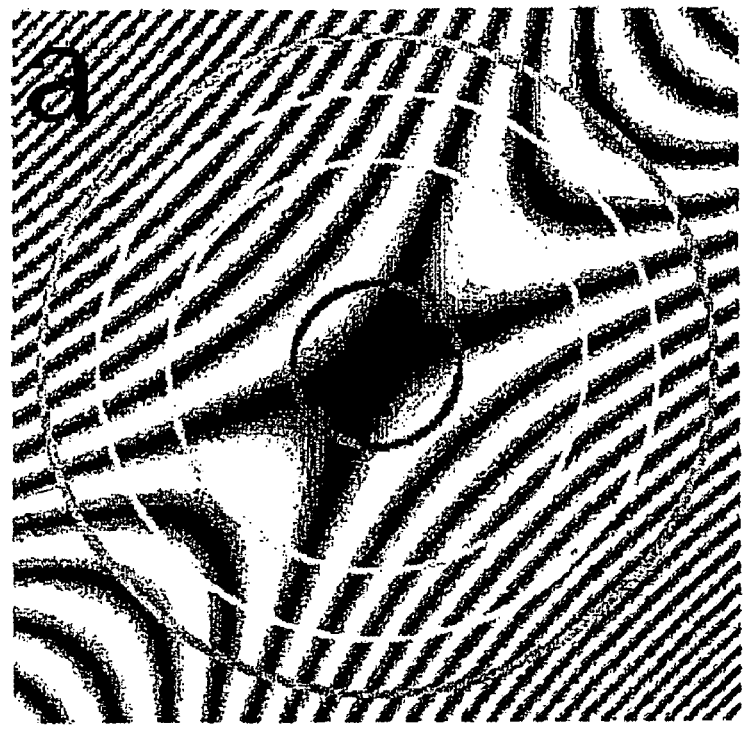
FIG. 3 shows examples of subimages, dependent on the simulated image.
Figure 3B:
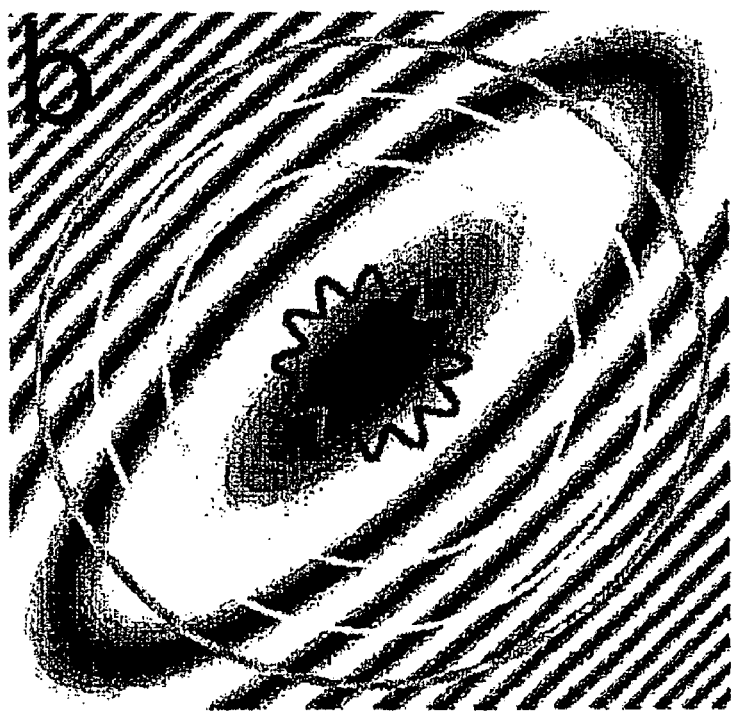
Figure 3C:
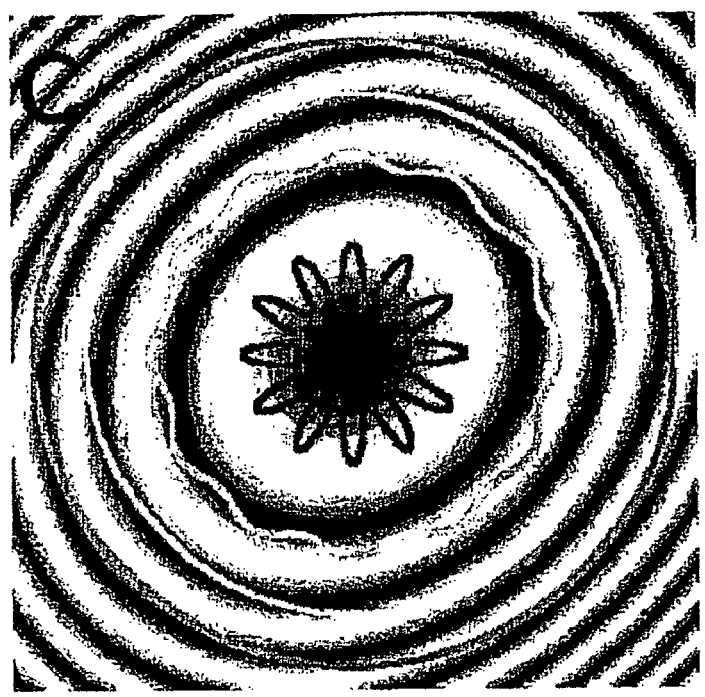

With the exception of the innermost subimage, each of these ring-shaped subimages has a Thon ring minimum and maximum. The intensity values in the line-shaped subimages vary across the maximum possible range, which keeps the defect in the determination of defocusing and astigmatism small. In FIGS. 3b (average astigmatism) and 3c (low astigmatism), some subimages deviate from the circular shape in order to satisfy this requirement.

Figure 3D:
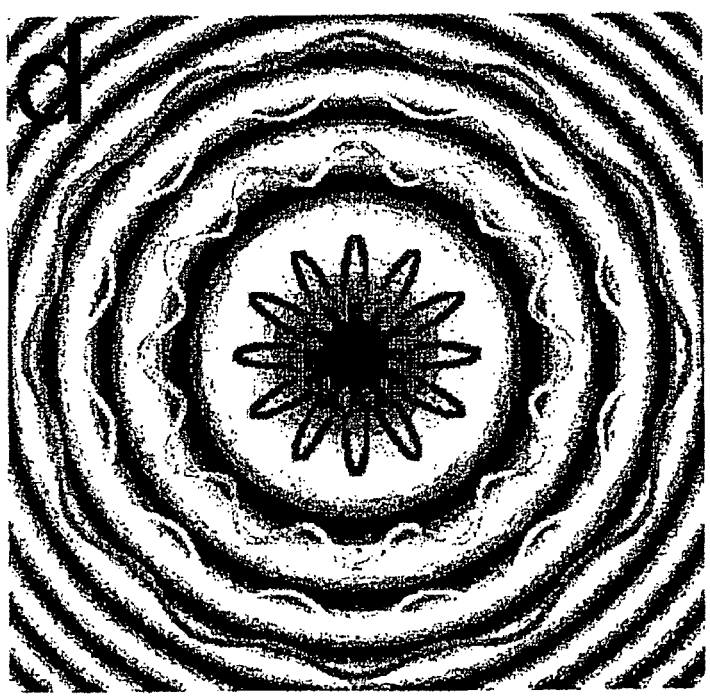

In FIG. 3d (no astigmatism), all subimages must deviate from the circular ring shape. Otherwise, within each circular ring-shaped subimage, the useful signal would be constant, allowing no information to be obtained in terms of defocusing. In this embodiment, the subimages have a shape that is periodically modulated around a circular ring line. This shape was determined adaptively in that the line curvature was varied until the variation of the useful signal exceeded a predetermined threshold value.

In general, the deviations of the subimages from the circular ring shape should selected to be only so large that the useful signal in these regions will vary strongly enough in order to be differentiated from noise. The lower they are selected, the better the additive and multiplicative interferences are suppressed.

The overall result F of the similarity between experimentally measured and simulated images can be computed from the individual results $f_p$ for a set p of image sections used for the comparison, for example according to the formula $$F = \sum_p w_p f_p$$

wherein $w_p$ constitutes the weighting factors.

In place of the diffractograms shown in the figures, it is also possible to evaluate rhonchigrams, which likewise have Thon rings in the sub-sections. In place of the transmission electron microscope used in FIG. 1, it is also possible to use a scanning transmission electron microscope (STEM).

A computer program running on a computer is particularly suited for performing the method.

The invention claimed is:

1. A method for measuring similarity of two two-dimensional images, each comprised of pixels having intensity values and a useful signal that is to be used for comparing the two two-dimensional images, at least one image of the two two-dimensional images further comprising an additional signal having a direction gradient and a direction perpendicular to the direction gradient, the method comprising:
    partitioning the two two-dimensional images, respectively, into mutually corresponding subimages, wherein an extension of at least one subimage of said at least one image in the direction of the gradient of the additional signal is smaller than the extension of said at least one subimage in the direction perpendicular thereto, wherein the useful signal of said at least one image in the subimage changes in a characteristic and detectable manner, while the additional signal changes only slightlly, and wherein the subimages can be line-shaped or ring-shaped,
    comparing mutually associated subimages with one another; and
    combining the results of these comparisons into an overall measure of the similarity of the two images.

2. The method according to claim 1, comprising at least one line-shaped subimage.

3. A method according to claim 1, comprising at least one ring-shaped subimage.

4. A method according to any one of claims 1 to 3, comprising comparing mutually associated subimages to one another using a similarity measure from the group of cross-correlation coefficient, sum of error squares, or chi-square sum.

5. A method according to claims 1, comprising combining the results of the comparisons of subimages via a linear combination into an overall measure of the similarity of the two images.

6. The method according to claim 5, comprising taking the subimages into consideration in the linear combination using weighting factors, which increase with increases in the number of pixels contained in the subimages.

7. A method according to any one of claims 1 to 3, wherein an additional signal that, in polar coordinates, depends more strongly on the radius than on the azimuth.

8. A method according to any one of claims 1 to 3, wherein the union set of all subimages comprises a share of at least 80 percent of all pixels.

9. A method according to any one of claims 1 to 3, comprising overlapping subimages.

10. A method according to any one of claims 1 to 3, comprising using an experimentally measured image and a simulated image as the images.

11. The method according to claim 10, comprising using preferred regions, in which the intensity values of the simulated image vary at least across a predetermined fluctuation range.

12. A method according to claim 10, wherein a new simulated image is determined from the measurement result, said image being more similar to the experimentally measured image than the originally simulated image.

13. The method according to claim 12, comprising using an electron microscope for obtaining the experimentally measured image.

14. The method according to claim 13, comprising using at least the parameters of defocusing and astigmatism for generating the simulated image.

15. A method according to claim 13, wherein aberrations of the electron microscope are determined from the measured similarity.

16. The method according to claim 15, comprising adjusting the electron microscope so as to correct the determined aberrations, whereafter the method is started again.

17. A method according to claim 12, comprising using the simulated image, prior to partitioning, by way of a quick comparison with the experimentally measured image.

18. The method according to claim 17, wherein the intensity values of the pixels of at least one of the images are discretized, for quick comparison, to 16 or fewer possible values per pixel.

19. The method according to claim 18, comprising using a logic operation for quick comparison to the discretized image.

20. A method according to claim 17, comprising using the simulated image from a precomputed catalog.

21. The method according to claim 17, wherein the intensity values of the pixels of at least one of the images are discretized for quick comparison to two possible values per pixel.

22. The method according to claim 18, comprising using a logic operation exclusive Or (XOR) for quick comparison to the discretized image.

23. An electron microscope having a digital image sensor, a device for tilting an electron beam relative to an object to be analyzed, a plurality of lenses, a controller that determines an arrangement of the lenses, and an adjustment device that adjusts the arrangement of lenses, and comprising:
  a simulation unit, which is configured to deliver ideal electron-microscopic images of test structures having predetermined values for defocusing and astigmatism thereof;
  a comparison unit, which is connected to the image sensor and the simulation unit and which is configured to measure similarity between a non-ideal two-dimensional image supplied by the image sensor and an ideal two-dimensional image supplied by the simulation unit, comprising means for partitioning the non-ideal image and the ideal image into mutually corresponding subimages, wherein an extension of at least one subimage of said at least one image of the ideal and non-ideal two-dimensional images in the direction of the gradient of the additional signal is smaller than the extension of said at least one subimage in the direction perpendicular thereto, wherein the useful signal of said at least one image in the subimage changes in a characteristic and detectable manner, while the additional signal changes only slightlly; and
  an evaluation unit, which is connected to the comparison unit and the controller and which is configured to approximately determine aberrations of the electron microscope from measured similarity and associated defocusing and astigmatism values and convert them into an adjustment command for the controller.

24. The electron microscope according to claim 23, comprising a comparison unit which is able to perform the method comprising:
  partitioning the ideal and non-ideal two-dimensional images, respectively, into mutually corresponding subimages, wherein an extension of at least one subimage of said at least one image of the ideal and non-ideal two-dimensional images in the direction of the gradient of the additional signal is smaller than the extension of said at least one subimage in the direction perpendicular thereto, wherein the useful signal of said at least one image in the subimage changes in a characteristic and detectable manner, while the additional signal changes only slightlly, and wherein the subimages can be line-shaped or ring-shaped,
  comparing mutually associated subimages with one another; and
  combining the results of these comparisons into an overall measure of the similarity of the ideal and non-ideal images.

25. An electron microscope according to claim 23, comprising means for a discretization of the intensity values of the pixels of at least one of the images to 16 or fewer possible values per pixel.

26. The electron microscope according to claim 25, comprising means for an exclusive Or operation (XOR) between two discretized images.

27. An electron microscope according to claim 23, comprising a comparison unit comprising a digital signal processor (DSP).

28. An electron microscope according to claim 23, wherein the adjustment unit comprises at least one computer having a computer program.

29. The electron microscope according to claim 28, comprising an embedded system as the computer.

30. A method according to any one of claims 1 to 3, wherein the union set of all subimages comprises a share of at least 90 percent of all pixels.

31. An electron microscope, comprising a digital image sensor, a device for tilting an electron beam relative to an object to be analyzed, a plurality of lenses, a controller that determines an arrangement of the lenses, and an adjustment device that adjusts the arrangement of lenses, and comprising:
  a simulation unit, which is configured to deliver ideal electron-microscopic images of test structures having predetermined values for defocusing and astigmatism thereof;
  a comparison unit, which is connected to the image sensor and the simulation unit and which is configured to measure similarity between a non-ideal image supplied by the image sensor and an ideal image supplied by the simulation unit;
  an evaluation unit, which is connected to the comparison unit and the controller and which is configured to approximately determine aberrations of the electron microscope from the measured similarity and associated defocusing and astigmatism values and convert them into an adjustment command for the controller;
  said comparison unit partitioning the images into mutually corresponding subimages such that an extension of at least one subimage in the direction of a gradient of an additional signal is smaller than the extension of said at least one subimage in the direction perpendicular thereto, and wherein the subimages can be line-shaped or ring-shaped;

mutually associated subimages being compared with one another; and results of these comparisons being combined into an overall measure of similarity of the ideal and non-ideal images.

* * * * *